US006445798B1

(12) United States Patent
Spikener

(10) Patent No.: US 6,445,798 B1
(45) Date of Patent: Sep. 3, 2002

(54) METHOD OF GENERATING THREE-DIMENSIONAL SOUND

(76) Inventor: Richard Spikener, 70 E. 8th St., #5G, Brooklyn, NY (US) 11218

( * ) Notice: Subject to any disclaimer, the term of this patent is extended or adjusted under 35 U.S.C. 154(b) by 0 days.

(21) Appl. No.: 09/010,326

(22) Filed: Jan. 21, 1998

Related U.S. Application Data

(60) Provisional application No. 60/036,876, filed on Feb. 4, 1997.

(51) Int. Cl.[7] ................................................ H03G 3/00

(52) U.S. Cl. .............................. 381/63; 381/61; 381/64

(58) Field of Search .............................. 381/61, 62, 63, 381/66, 64, 17, 1; 463/35; 84/DIG. 29

(56) References Cited

U.S. PATENT DOCUMENTS 3,530,249 A 9/1970 Rahway
4,731,848 A 3/1988 Kendall
4,817,149 A 3/1989 Myers
5,337,363 A 8/1994 Platt
5,469,511 A 11/1995 Lewis
5,487,113 A 1/1996 Mark

*Primary Examiner*—Minsun Oh Harvey
(74) *Attorney, Agent, or Firm*—Herbert Dubno

(57) ABSTRACT

To produce a three dimensional sound, an original sound recording is duplicated and the original of its duplicate are then recorded with a time delay in the range of 25 ms to 990 ms, preferably 100 to 500 ms. The resulting first echo recording is duplicated to produce a second echo recording and these are recorded with another time delay, preferably less than the first but within the aforementioned range to yield a fifth tape which has a so-called third echo imparting to the sound a three-dimensionality which cannot be achieved by conventional reverberation and echo methods.

16 Claims, 5 Drawing Sheets

METHOD OF GENERATING THREE-DIMENSIONAL SOUND

CROSS REFERENCE TO RELATED APPLICATION

This application is related to my provisional application No. 60/036,876 filed Feb. 4, 1997.

FIELD OF THE INVENTION

The present invention relates to the generation of three-dimensional sound and, more particularly, to the creation of a new kind of sound which, unlike reverberatory or reflective echo effects, appears to have a three-dimensionality in space which does not depend upon reflection, which appears to move toward the listener and to rotate in space, rather than simply receding from the listener and which, in general, utilizes a unique space to create a three-dimensionality quite different from conventional decaying echo effects.

BACKGROUND OF THE INVENTION

While there have been many efforts to create three-dimensional effects with sound, I have considered especially U.S. Pat. No. 5,337,363 dated Aug. 9, 1994, entitled METHOD FOR GENERATING THREE DIMENSIONAL SOUND, U.S. Pat. No. 4,817,149 issued Mar. 28, 1989 entitled THREE-DIMENSIONAL AUDITORY DISPLAY APPARATUS AND METHOD UTILIZING ENHANCED BIONIC EMULATION OF HUMAN BINAURAL SOUND LOCALIZATION, U.S. Pat. No. 5,487,113 issued Jan. 23, 1996 entitled METHOD AND APPARATUS FOR GENERATING AUDIOSPATIAL EFFECTS, U.S. Pat. No. 5,469,511 issued Nov. 21, 1995 entitled METHOD AND APPARATUS FOR PRESENTATION OF ON-LINE DIRECTIONAL SOUND and U.S. Pat. No. 4,731,848 issued Mar. 15, 1988 entitled SPATIAL REVERBERATOR.

These patents disclose various techniques for generating reverberation and echo effects.

Over the past three decades the sound production field has been searching for "true three dimensional" sound. Although there have been amazing developments in sound production such as: digital time-delay effects, prologic surround sound and cinema, illusional, three-dimensional audio, true three-dimensional sound has remained undiscovered.

The failure to produce "true three-dimensional" sound begins with the confusion among artists as to what is meant by a three-dimensional sound. Artists have believed sounds made in acoustical environments either natural such as tunnels or caves or man-made such as a concert hall or cathedral are truly three dimensional because of the sensations of depth and spaciousness. This belief led to the development of machines which mimicked those previously mentioned acoustical environments.

Other artists believed that relative to the listener's position, sounds could appear to be moving from one location to another location such that a listener could follow the sound; such sound also have heretofore been treated as "true three-dimensional" sound. By studying human sound localization, sound cues were developed which were to aid the listener is locating sounds in three-dimensional space. Such techniques as using templates, gray and while noise patterns, multiple microphones used to generate different arrival times to the human ears were employed to emulate human binaural sound localization discussed at length in Myers U.S. Pat. No. 4,817,149—"THREE-DIMENSIONAL AUDITORY DISPLAY APPARATUS AND METHOD UTILIZING ENHANCED BIONIC EMULATION OF HUMAN BINAURAL SOUND LOCALIZATION". By focusing on directionality the artists needed to add three more loud speakers to the existing two speaker stereo system in order to expand the stereo image and fool the listener into believing that sounds were actually moving around.

Such beliefs, these being only a couple among the many, have shown that the concept of three dimensionality has been obscured. So to clear away the confusion about the definition of "Real true three-dimensional" sound, I have posed two points of view. The logical view and the artistic view.

The logical view asks the question: What does it mean to be three dimensional?

The rule says: An object is considered three dimensional if it has a length, a width and a height of depth.

When this rule is applied to earth's air space, one can see that air is not an object with a length, a width and a height or depth. So even through air can be used to do work, air itself is not three dimensional. This means, the movement of air molecules by emanating vibrations which produces what we call "sounds" is also not three dimensional.

So, from the logical point of view there is no such thing as a "three dimensional" sound. From this viewpoint it would appear that artists are searching for something that does not exist. If this viewpoint is true, then what is it that "three dimensional" sound requires?

From an artistic point of view, the rule here is: sound images must appear to have a length, a width and a height or depth so realistic that it causes the human being to experience responses or reactions to those images as if they were real.

Such experiences in visual space are for example:

Trying to grab an object in a three-dimensional picture or hologram.

Attempting to avoid an object such as a pitchfork being brought closer to the audience by a character in a three-dimensional motion picture or the fear one experiences when viewing roller coaster travel in virtual reality.

These experiences a human being feels when viewing three-dimensional imagery are all a part of the concept of Dimensionality.

Dimensionality only occurs when three dimensions of length, width and height or depth are in some kind of space. Without some kind of space these images would remain two dimensional. By this definition a film space allows images in motion pictures to appear three dimensional.

Artists searching for "true three dimensional" sound should have taken a hint from the discovery of Cyberspace. If images on a computer screen can appear three dimensional due to cyberspace might there be an audio space where sounds can go and become three dimensional? If this question was asked, it would have become abundantly clear that these artists searching for "true three dimensional" sound were using the wrong space. These artists are using Earth's air space.

In this case the artists are using the logical view and are searching for something that does not exist. Without some kind of special space these artists are relying on trickery, stereophonic gimmickry and electronic wizardry in an attempt to fool listeners into believing the produced two-dimensional sound is actually three-dimensional sound.

It will therefore be a goal of my method to produce real, true, three dimensional sound contained inside a unique three-dimensional audio tape space thereby making the audio tape itself, the container.

OBJECTS OF THE INVENTION

It is, therefore, the principal object of the present invention to provide an improved method of producing a three-dimensional sound true to the effects described above and which, unlike the efforts previously used to improve depth perception in sound, is capable of generating a depth perception which is either nondirectional or multidirectional, does not depend on a reflective echo effect and is not characterized by damping, fading or decay of the echo.

Another object of this invention is to enhance sound so as to provide a recorded audio experience in which an originally recorded sound is greatly enhanced, especially by imparting an unusual three-dimensionality thereto.

It is also an object of the invention to make use of that unique space within the audio tape which has been alluded to previously. The audio space is not unique, what is unique ia a greater use of available space which stereo underuses. 3D exploits that space, by putting 4 sounds in the space.

SUMMARY OF THE INVENTION

These objects and others which will become apparent hereinafter are attained, in accordance with the invention, in a method of recording and reproducing a sound which transcends the conventional stereophonic recording reverberation and echo-generating techniques by utilizing delays between rerecorded otherwise identical signals so that an echo is ultimately generated following multigenerational recording that does not decay or constitute a reverberation, but rather creates a rotation of the sound in the space reaching the listener and as a result of a unique exploitation of the tape space.

According to this invention, the original sound is binaurally recorded and the original stereo tape recording is duplicated. These two identical tapes are then played through respective players each of which has a right and left channel output and the four outputs are selectively combined by Y-connectors or Y-couplers (reverse splitters) in pairs to generate the right and left channel inputs to a tape recorder. The resulting tape is again duplicated and the two tapes which then result are played again with a time-delay while the right and left audio outputs of the players are combined through Y-connectors or reverse splitters, again in any pairing to provide right and left channel inputs for recording of the fifth tape. That fifth tape carries the final recorded sound with a so-called third echo or three dimensionality which is readily apparent when that tape is played through a conventional player with right and left channel outputs.

Of course the process can be continued and, for to example, the fifth tape may be duplicated and the fifth tape and its duplicate can be played as a further time delay to serve as an input to a recorder through reverse splitters or Y-couplers, in which case the seventh tape thus resulting will carry the three-dimensional effect.

The inputs to the recorder following duplication, can have its right and left channels receive inputs from reverse splitters each of which has both output channels of a respective recorder or one output channel of one player and an output channel from the other player.

In all cases, the result will be the three dimensionality described above.

According to the invention, the time delay between playing of the duplicates for each channel of recording with the time offset can be between say 25 ms and 0.99 s (990 ms) with preferred values of the delay $\Delta_1$ in the first generation between 100 ms and 500 ms and in the second generation delay $\Delta_2$ between 50 ms and 250 ms. The $\Delta_1$ and $\Delta_2$ may be the same or different. Preferably the delay $\Delta_2$ is shorter than the delay $\Delta_1$.

The method of the invention thus comprises the steps of:

(a) binaurally recording an initial sound to form a first recording;

(b) duplicating the first recording to form a first duplicate;

(c) playing the first recording and the first duplicate with a first time delay $\Delta_1$ there between with respective players each having right and left channel outputs;

(d) combining one of the channel outputs of each of the players in a respective Y connector for each of a right and a left channel input of a recorder to form a second recording;

(e) duplicating the second recording to form a second duplicate;

(f) playing the second recording and the second duplicate with a second time delay $\Delta_2$ therebetween with respective players each having right and left channel outputs; and (g) combining one of the channel outputs of each of the players in step (f) in a respective Y connector for each of a right and a left channel input of a recorder to form a further recording carrying a three-dimensional sound signal.

In step (d) as described above, the right and left channel output of each player can be combined in a respective Y-connector to form a respective input of the recorder forming the second recording. Alternatively, the right and left channel outputs of each player may be combined with a right or left channel output of the other player in a respective Y-connector to form a respective input of the recorder forming the second recording. Similarly, in step (g), two channels outputs of each player can be combined in a Y-connector to a respective input of the recorder forming the further recording or a right channel output of one player and a channel output of the other player can be combined in a respective Y-connector to form an input for the further recording. The ability to select among outputs of the players in each case for the combination in respective Y-connectors as inputs for a subsequent recording, increases the versatility of the system of the invention.

BRIEF DESCRIPTION OF THE DRAWING

The above and other objects, features, and advantages will become more readily apparent from the following description, reference being made to the accompanying drawing in which.

SPECIFIC DESCRIPTION

Figure 3:
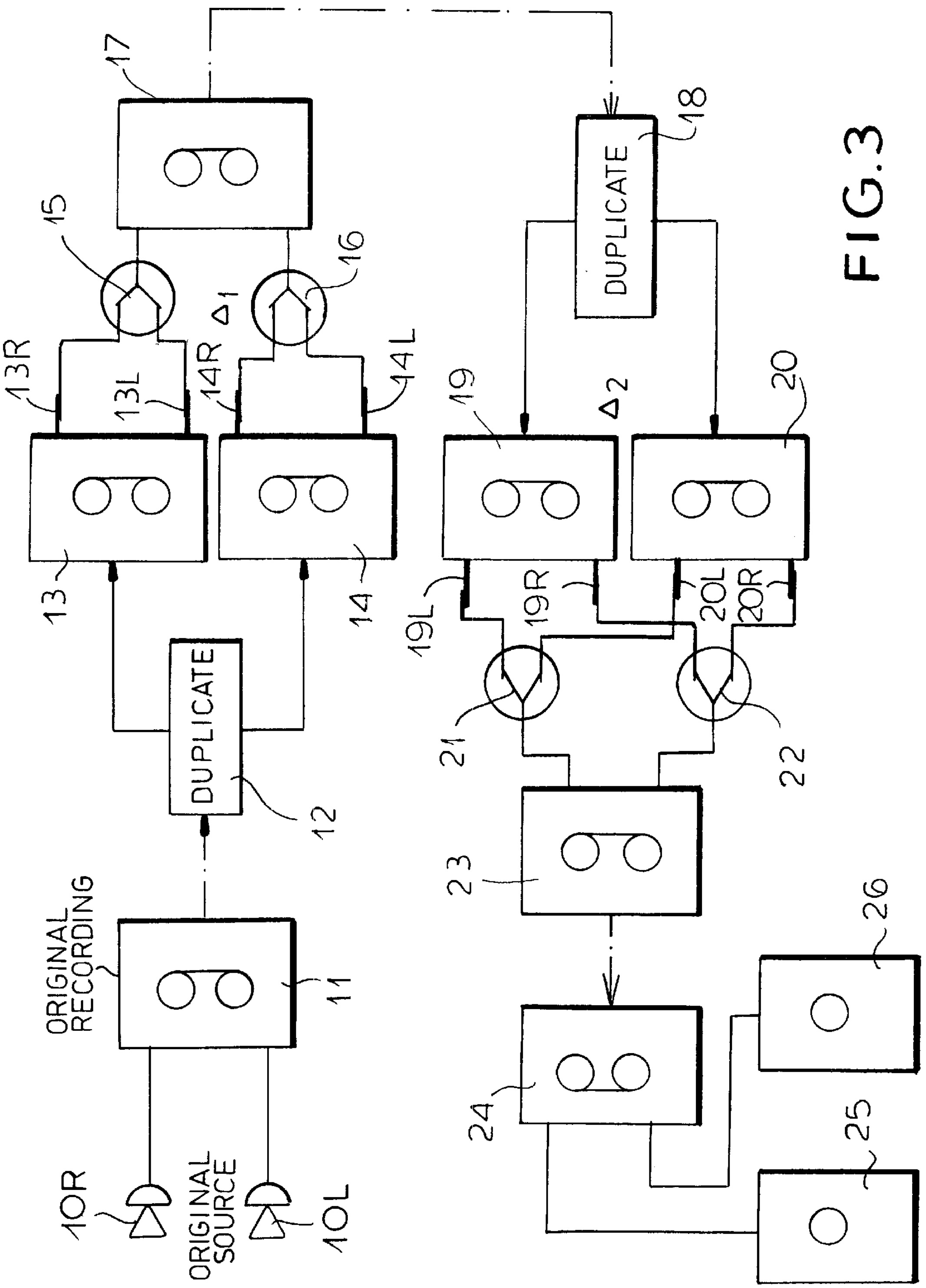
FIGS. 3, 4 and 5 are diagrams illustrating the process of the invention.
Figure 4:
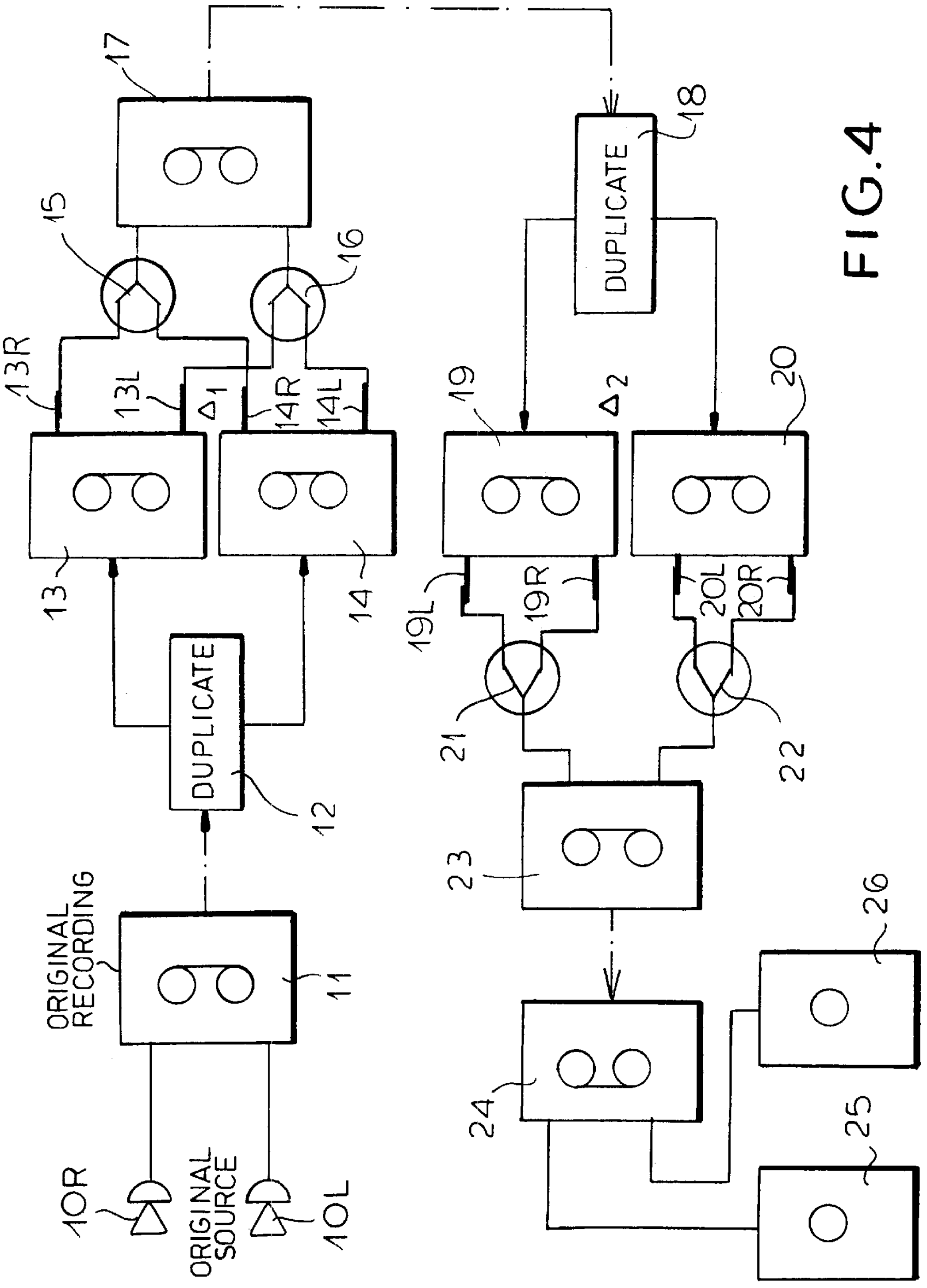
Figure 5:
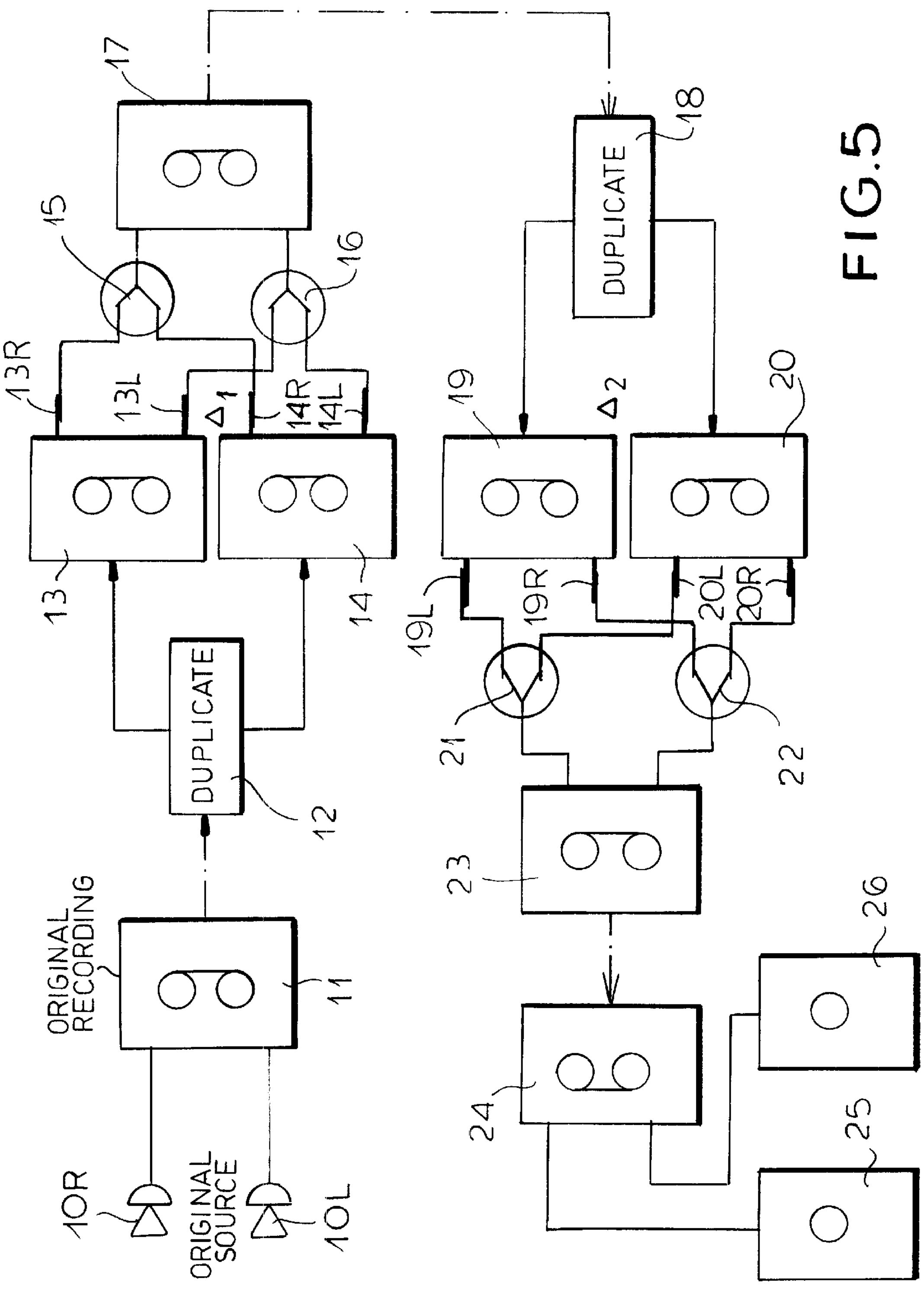

Turning first to FIGS. 3–5, it will be apparent that sound from an original source, here shown to be acquired by microphone-type pickups 10R and 10L can be provided as in tapes for an original recording in a player 11 capable of binaural recording. Instead of microphone-type pickups, the two channel input for the original recorder 11 can be from recorded sound sources or some other electronic medium.

According to the invention the original recording formed by the recorder 11 is duplicated at 12 to form a first recording and its first duplicate and the first resulting and the first duplicate are played back on players 13 and 14 having right and left channel outputs 13R and 13L, and 14R, 14L.

These outputs are combined in pairs in Y-couplers (see FIG. 2) to form inputs to a recorder 17 to form a second recording. The players 13 and 14 are operated with a delay $\Delta_1$ between them, preferably in the 100 ms to 500 ms range.

The second recording formed at 17 is duplicated at 18 to form a second duplicate and the second recording and the second duplicate are played by players 19 and 20 with a delay $\Delta_2$ between them. The players 19 and 20 have right and left channel outputs 19R, 19L and 20R, 20L. The delay $\Delta_2$ is preferably between 25 ms and 250 ms and can be, for example, 50 ms.

These outputs are combined in pairs by respective Y-couplers 21 and 22 forming inputs to the recorder 23 in which the further recording of the invention is made. That recording is the ultimate tape, referred to elsewhere herein as the fifth tape or recording and carries the three-dimensional sound signal. It can be played, as desired, on any player 24 with stereophonic is speakers 25, 26 or any other conventional array of speakers.

While, to illustrate the process of the invention, a large number of recorders and players has been illustrated in FIGS. 3, 4 and 5, obviously the same recorder or player may be used a number of times.

In FIG. 3, the right and left outputs of the players 13, 14 and 19, 20 are combined in respective Y-couplers 15, 16, 21 and 22 as inputs to the recorders 17 and 23.

In FIG. 4, a right channel output 13R and 14R from each player 13, 14 are combined in the Y-coupler 15 as an input to the recorder 17 and the left channel outputs of the players 13 and 14 are combined as another input to the recorder 17. The outputs of the players 19 and 20, however, do not cross over in this embodiment.

In the variant of FIG. 5, however, the right channel outputs and left channel outputs of the players 13 and 14 are combined in pairs as are the right channel outputs and left channel outputs of the players 19 and 20.

In all three cases, the recording at 23 contains the third echo effect of the invention which is a nondecaying echo ensuring room-filling three-dimensional sound which travels in space to the perception of the listener not only away from the listener but also toward the listener and in a figure-eight, linear or curvilinear pattern. The particular pattern will depend upon the relative delays $\Delta_1$ and $\Delta_2$ and the manner in which the outputs of the players are combined.

In each playback, i.e. from the recordings in the players 13 and 14 to the recording in the recorder 17 and from the players 19 and 20 to the recording at 23, the playback may be effected with controlled attenuation of either or both channels or with control of the balance between channels. Finally, as a general matter, while the invention will be explained in greater detail with respect to tape recordings, any other recording modality or technique can be used as well, e.g. disk, digital or some like recording technique.

Turning back to FIG. 1 which represents the set-up of the method utilizing two tape machines as sound sources 1 and 2 at A and E and a recording source D for combining the original sound and the time-delayed sound for each stage, A is sound source 1 and is connected by two RCA wires B from sound source 1—output plug to a Y-coupler or splitter C which is inserted into the left input plug of recording source D which allows the left and right signal of sound source 1 to be heard from loudspeaker H.

E—is sound source 2 and is connected by two RCA wires F from sound source 2—output plug to a Y-coupler or splitter 6 which is inserted into the right input plug of recording source D which allows the left and right signal of sound source 2 to be heard from loudspeaker I.

The speakers H and I are monitors which allow the person making the recording to hear the combined inputs to each side of the recording source.

Figure 1:
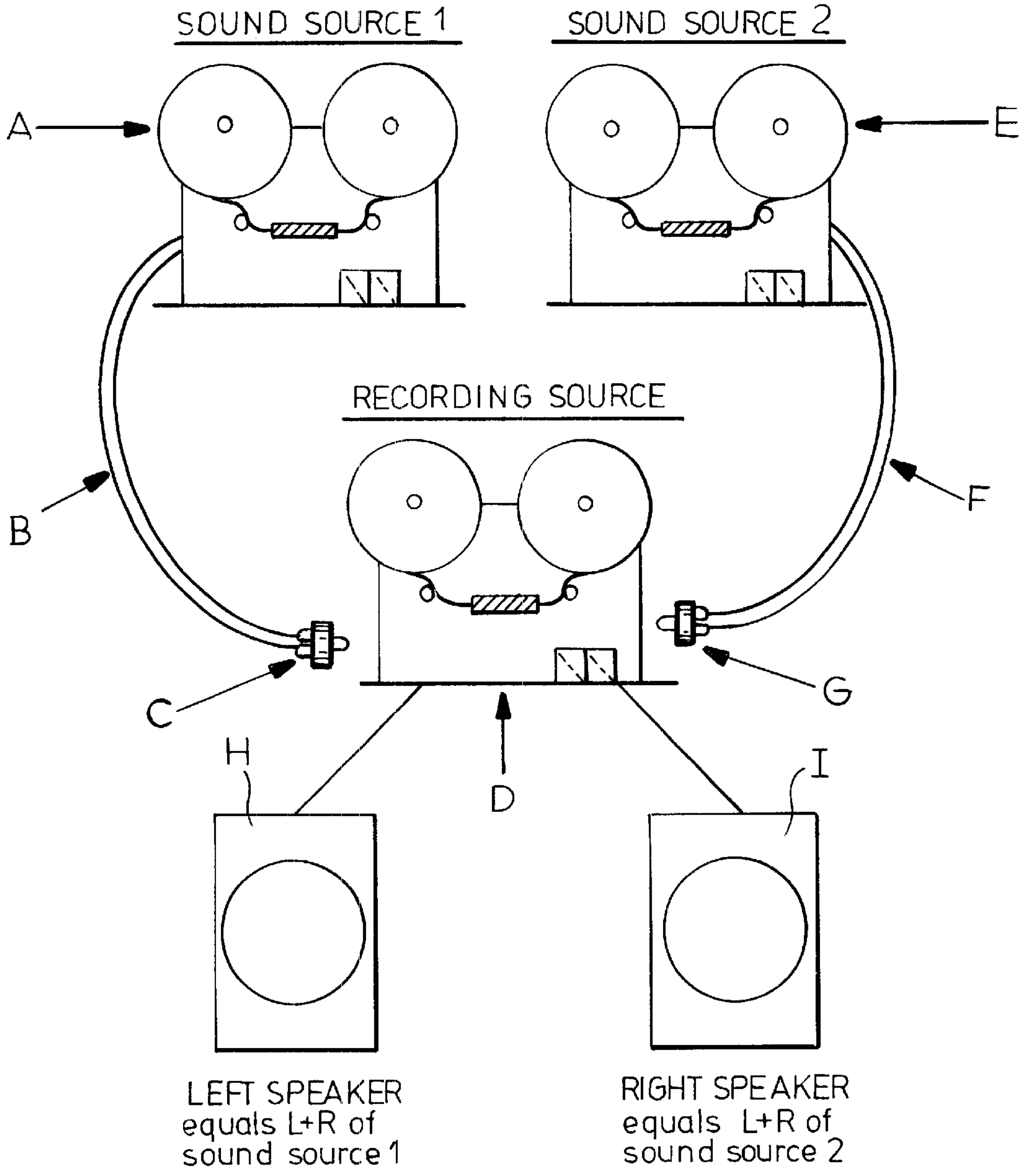
FIG. 1 is a diagram illustrating a principle of the invention whereby right and left channels of a player are combined in Y-connectors as inputs to a recorder, the players being operated with time-delay $\Delta_1$ or $\Delta_2$ between them.
Figure 2:
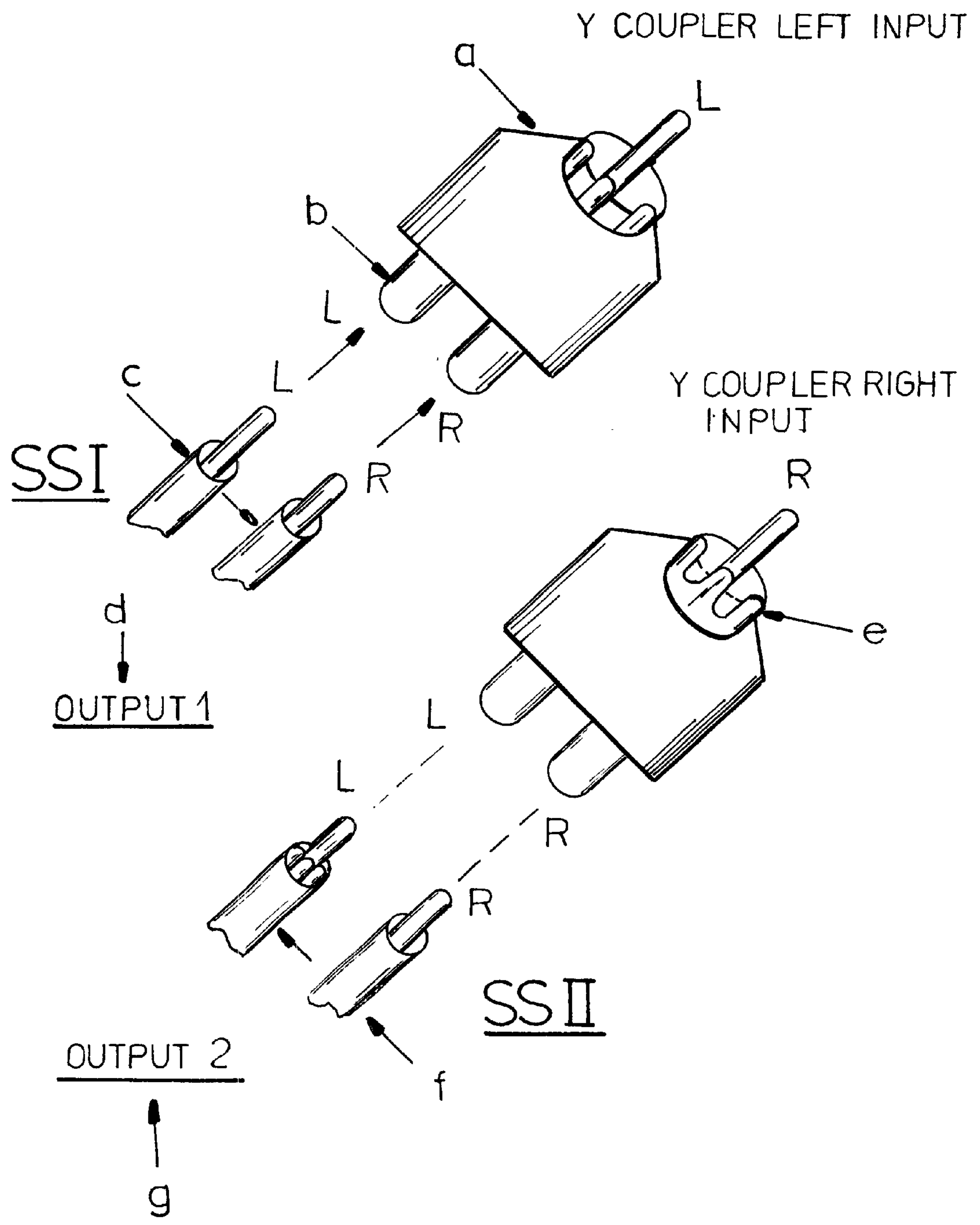
FIG. 2 is a diagram in a perspective view showing the Y-connectors or couplers utilized in accordance with the invention.

The diagram of FIG. 2 represents the left and right Y-couplers, Y-connectors or reverse splitters.

a—Left coupler showing top plug for insertion into the left input jack of the recording source in FIG. 1.

b—Left and right jacks underneath the Y-coupler for insertion of the left and right c mono wires which are coming from d output 1 of sound source 1 in FIG. 1.

e—This is the right coupler as described in a for the left coupler.

f—Left and right mono wires which are coming from g output 2 of sound source 1 in FIG. 1.

Combined left and right couplers or splitters combine two whole stereo channels into one input. This allows two sounds "identical" or different to be heard at or about the same time.

In practice, the method requires the use of three audio tape machines preferably of the same make and model; this way notched controls on each machine will hopefully be about the same for each machine.

These tape machines should be push-button controlled and be of such quality as to allow abuse of the controls such as fast forward, stop and rewind.

There should be separate volume, bass and balance controls, preferably of the notched filter type on each machine as well as a Vv meter or bar-graph potentiometer for monitoring and adjusting volume and balance outputs.

The machines should be capable of parallel recording for cutting down on recording time but this feature is not necessary. A quick search for finding the beginning of a piece is a useful feature when quick alignment of two tracks is needed.

The back of the tape machines must have stereo line input and output jacks preferably RCA connectors.

The three tape machines are separated into one recording source and two play sources. Each play source should have a graphic equalizer or each play source should have a four or five band multiple tone control.

An amplifier can be employed to boost the signals from each sound source before they reach the recording source.

Two loudspeakers are needed for monitoring the lefts and rights of the two sound sources.

Two stereo wires are attached to each sound source output plug. These four wires are then plugged into two Y-splitters or couplers which are then inserted into the left and right input plugs of the recording source. When connected, there is now a whole stereo signal coming from sound source 1 which can be heard from only the left speaker. The same is true for the right speaker where only sound source 2 is heard. This is "Dual or Parallel Tracking."

The variability in the recording within the control of the operator allows adjustment of the volumes of each channel at each recording, the balance between the channels, the amount of bass and/or treble at each channel and the manner of interconnection as has been described, all in addition to control of the delay. The delay may be selected automatically by placing the delayed machine on a timer, or can be controlled manually by simply fingering the controls of the player which is to be delayed after the leading player has been turned on.

The effect is, as had been noted, not a conventional reverberation or echo, but rather a so-called third echo which appears to be generated in the tape space of the fifth tape and when played back contributes to a sound phenomenon which causes sound to roll both forward and back and in an arcuate pattern through the listener's space. Basically the method uses five audio tapes, the first of which can be treated as the original sound or an original sound recording, tape 2 is a duplicate of tape 1, tape 3 is a recording formed of both tapes 1 and 2 with a time delay of say 100 ms between them. Tape 3 thus carries a sound signal bearing an echo which, for the purposes of this application can be treated as echo 1. The fourth tape is a duplicate of tape 3 and is an echo 1 copy. It can also be referred to as echo 2 tape. Tape 5 is a recording made by playing the echo 1 and echo 2 tapes with the time delay which can be as low as 50 ms and carries the third echo phenomenon of the invention.

I claim:

1. A method of generating three-dimensional sound comprising the steps of:

(a) binaurally recording an initial sound to form a first recording;

(b) duplicating said first recording to form a first duplicate;

(c) playing said first recording and said first duplicate with a first time delay $\Delta_2$ therebetween with respective players each having right and left channel outputs;

(d) combining one of the channel outputs of each of said players in a respective Y connector for each of a right and a left channel input of a recorder to form a second recording;

(e) duplicating said second recording to form a second duplicate;

(f) playing said second recording and said second duplicate with a second time delay $\Delta_2$ therebetween with respective players each having right and left channel outputs; and (g) combining one of the channel outputs of each of said players in step (f) in a respective Y connector for each of a right and a left channel input of a recorder to form a further recording carrying a three-dimensional sound signal.

2. The method defined in claim 1 wherein said time delays $\Delta_1$ and $\Delta_2$ range between 25 ms and 0.99 s.

3. The method defined in claim 1 wherein in step (d), right and left channel outputs of each player are combined into a respective Y connector to form a respective input of the recorder forming said second recording.

4. The method defined in claim 1 wherein in step (d) a right channel output of one player and a left channel output of a the other player are combined into a respective Y connector to form a respective input of the recorder forming said second recording.

5. The method defined in claim 1 wherein in step (g), right and left channel outputs of each player are combined into a respective Y connector to form a respective input of the recorder forming said further recording.

6. The method defined in claim 1 wherein in step (g) a right channel output of one player and a left channel output of the other player are combined into a respective Y connector to form a respective input of the recorder forming said further recording.

7. The method defined in claim 1 wherein each of said recordings and said duplicates is a tape and said time delays $\Delta_1$ and $\Delta_2$ range between 25 ms and 0.99 s.

8. The method defined in claim 7 wherein in step (d), right and left channel outputs of each player are combined into a respective Y connector to form a respective input of the recorder forming said second recording.

9. The method defined in claim 8 wherein in step (g), right and left channel outputs of each player are combined into a respective Y connector to form a respective input of the recorder forming said second recording.

10. The method defined in claim 8 wherein in step (g) a right channel output of one player and a left channel output of the other player are combined into a respective Y connector to form a respective input of the recorder forming said further recording.

11. The method defined in claim 7 wherein in step (d) a right channel output of one player and a left channel output of the other player are combined into a respective Y connector to form a respective input of the recorder forming said second recording.

12. The method defined in claim 11 wherein in step (g), right and left channel outputs of each player are combined into a respective Y connector to form a respective input of the recorder forming said further recording.

13. The method defined in claim 11 wherein in step (g) a right channel output of one player and a left channel output of the other player are combined into a respective Y connector to form a respective input of the recorder forming said further recording.

14. The method defined in claim 1 wherein said time delay $\Delta_1$ ranges between 100 ms and 500 ms.

15. The method defined in claim 14 wherein said time delay $\Delta_s$ is shorter that said time delay $\Delta_{1.}$

16. The method defined in claim 15 wherein said time delay $\Delta_s$ is about 50 ms.

* * * * *